United States Patent
Horaguchi et al.

(10) Patent No.: US 6,925,106 B2
(45) Date of Patent: Aug. 2, 2005

(54) PREDISTORTION TYPE DISTORTION COMPENSATION APPARATUS

(75) Inventors: Masato Horaguchi, Tokyo (JP); Naoki Hongo, Tokyo (JP); Takashi Uchida, Tokyo (JP); Masaki Suto, Tokyo (JP); Toshio Takada, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 774 days.

(21) Appl. No.: 09/880,958

(22) Filed: Jun. 15, 2001

(65) Prior Publication Data

US 2002/0101938 A1 Aug. 1, 2002

(30) Foreign Application Priority Data

Feb. 1, 2001 (JP) ........................................ 2001-025419

(51) Int. Cl.[7] .............................................. H04L 27/30
(52) U.S. Cl. ....................... 375/146; 375/285; 375/296; 330/260; 330/271; 330/284; 455/115; 455/126
(58) Field of Search ................................ 375/130, 146, 375/285, 295, 296, 297, 299; 330/254, 260, 271, 278, 284, 294; 455/115, 123, 126

(56) References Cited

U.S. PATENT DOCUMENTS 5,054,116 A * 10/1991 Davidson .................... 455/126
6,396,879 B1 * 5/2002 Yoshimura et al. .......... 375/297
6,400,775 B1 * 6/2002 Gourgue et al. ............. 375/296
6,515,712 B1 * 2/2003 Jeong ......................... 348/608

* cited by examiner

Primary Examiner—Dac V. Ha
(74) Attorney, Agent, or Firm—Wenderoth, Lind & Ponack, L.L.P.

(57) ABSTRACT

To update the control value to a value of higher precision in a predistortion type distortion compensation apparatus for compensating the distortion occurring in an amplifier for amplifying an input signal by the control using a control value corresponding to the level of the input signal.

Distortion generating means (1) generates distortion in an input signal, input signal level detecting means (3) detects the level of the input signal, distortion control means (4) controls the distortion generated by the distortion generating means 1 by using a control value corresponding to the level of the detected input signal, distortion component level detecting means (7) detects the level of distortion component contained in the amplified signal issued from the amplifier (2), integrating means K1 to KN integrate the level of the distortion component detected at every level of the detected input signal, and control value updating means (10) updates the control value corresponding to the level so that the integration result at every level of the input signal may be small.

14 Claims, 8 Drawing Sheets

PREDISTORTION TYPE DISTORTION COMPENSATION APPARATUS

BACKGROUND OF THE INVENTION

1. Field of the Invention

The present invention relates to a predistortion type distortion compensation apparatus for compensating the distortion occurring in an amplifier for amplifying an input signal by the control using a control value corresponding to the level of the input signal, and more particularly to a technique of updating the control value to a more precise value.

2. Description of the Related Art

For example, in a base station apparatus (CDMA base station apparatus) of a mobile communication system conforming to a W-CDMA (wide-band code division multiple access) mobile communication method, the radio signal must be sent to a mobile station apparatus (CDMA mobile station apparatus) physically at a long distance, and the transmission signal must be sent out by largely amplifying by an amplifier.

However, the amplifier is an analog device, and there is limitation in amplification. This limitation in amplification is also known as a saturation point, and after the saturation point, the output power is unchanged if the power entered in the amplifier is increased, and the output is nonlinear. This nonlinear output causes a nonlinear distortion.

FIG. 7 shows an example of spectrum of transmission signal before input into the amplifier, and FIG. 8 shows an example of spectrum of the transmission signal amplified and issued by the amplifier when distortion is not compensated. In FIG. 7 and FIG. 8, the axis of abscissas of the graph indicates the frequency (in kHz) and the axis of ordinates denotes the power ratio (in dB).

As shown in FIG. 7, in the transmission signal before amplification, the signal component out of desired signal band is suppressed to a low level by the band limiting filter, but in the signal after passing through the amplifier, as shown in FIG. 8, the signal is distorted, and signal component has leaked to outside of the desired signal band (adjacent channel).

For example, in the base station apparatus, since the transmission power is high as mentioned above, the magnitude of leak power to adjacent channel is strictly regulated, and it is an important problem how to curtail such adjacent channel leak power (ACP).

As means for curtailing the adjacent channel leak power, an example of a transmission power amplifier with distortion compensation used in a conventional base station apparatus is explained.

FIG. 9 is a structural example of such transmission power amplifier with distortion compensation, and its operation is explained.

In the transmission power amplifier with distortion compensation, a transmission signal (including I component and Q component) generated in a base band signal generator 61 is put into a vector adjusting unit (predistortion unit) 62 and a power measuring unit 69, and the transmission signal entering the vector adjusting unit 62 is compensated of distortion by this vector adjusting unit 62. The vector adjusting unit 62 is generally composed of a complex multiplier, and is designed to compensate the distortion of the transmission signal, according to the control from a controller 68 described below, by setting the amplitude-phase plane characteristic so as to be a reverse characteristic of the nonlinear characteristic of an amplifier 64 described below, and giving this characteristic (that is, the reverse characteristic) to the transmission signal as the distortion compensation characteristic.

The transmission signal compensated of distortion by the vector adjusting unit 62 is up-converted from the base band to the carrier frequency band by a transmission modulator 63, and is amplified by the amplifier 64, and is supplied into the antenna not shown.

In the amplifier 64, distortion occurs when amplifying the transmission signal, and the amplifying apparatus with distortion compensation is provided with a feedback system for detecting the residue of distortion for observing whether the distortion is compensated properly or not.

This feedback system comprises a local frequency generator 65, a demodulator 66, and an A/D converter 67, and part of the output signal (amplified signal) of the amplifier 64 supplied into the antenna is, for example, taken out by a directional coupler, and put into the demodulator 66.

In the feedback system, the amplified signal entered from the directional coupler into the demodulator 66 is demodulated by using a local signal entered from the local frequency generator 65 into the demodulator 66, and the demodulated signal is converted from analog signal into digital signal by the A/D converter 67, and the digital signal is put into the controller 68.

In the power measuring unit 69, the power of transmission signal (transmission power) entered from the base band signal generator 61 is detected, and the detection result is sent to the controller 68.

The controller 68 is composed of, for example, DSP (digital signal processor), and it detects the residual distortion amount from the digital signal entered from the A/D converter 67, and controls the vector adjusting unit 62 so that the distortion may be compensated properly by the vector adjusting unit 62 on the basis of the detection result. In this control, it is controlled so that the distortion compensation characteristic corresponding to the transmission power noticed from the power measuring unit 69 may be used in the distortion compensation.

As described herein, according to the transmission power amplifier with distortion compensation shown in FIG. 9, appropriate distortion compensation is done for the distortion occurring in the amplifier 64, and an efficient transmission power amplification process is realized.

FIG. 10 shows an example of spectrum of the transmission signal amplified and issued by the amplifier 64 when distortion is thus compensated, and in this signal spectrum, the adjacent channel leak power is curtailed substantially. The axis of abscissas of the graph indicates the frequency (in kHz) and the axis of ordinates denotes the power ratio (in dB).

Several prior arts relating to such distortion compensation are presented below.

For example, in the digital wireless apparatus disclosed in Japanese Laid-open Patent No. 9-294144, distortion is compensated by using a feedback system similar to the one shown in FIG. 9, and in this feedback system, same as in FIG. 9, the required signal to be transmitted (the original transmission signal) is down-converted together with undesired signal generated in adjacent channel (that is, the distortion generated in the amplifier), and all signals are processed by orthogonal demodulation or the like.

In the automatic follower type predistorter disclosed in Japanese Patent Publication No. 63-10613, distortion occurring in the amplifier is compensated by using the feedback system similar to the one shown in FIG. 9, and this feedback system, similarly, demodulates the amplified signal including the transmission signal band (that is, reproduces the base band signal before modulation), and processes by A/D conversion or the like.

Although not intended to compensate distortion, in the measuring apparatus and measuring method of adjacent channel leak power disclosed in Japanese Laid-open Patent No. 9-138251, same as above, the carrier signal (corresponding to the required signal) is taken out together with the adjacent channel signal (corresponding to undesired signal), and they are processed by fast Fourier transform (FFT), and the adjacent channel leak power ratio (power ratio of required signal and undesired signal).

As in distortion compensation of the transmission power amplifier with distortion compensation shown in FIG. 9, the predistortion system is known as one of the methods of compensating distortion occurring in the amplifier. In the predistortion system, the reverse characteristic of the nonlinear characteristic of the amplifier is preliminary given to the signal to be entered in the amplifier, and distortion occurring in the amplifier is compensated. The nonlinear characteristic of the amplifier includes the AM-AM characteristic changing the level of output signal nonlinearly depending on the level of input signal, and AM-PM characteristic changing the phase of output signal nonlinearly depending on the level of input signal.

FIG. 11 shows other circuit example of the apparatus employing such predistortion system (predistortion type distortion compensation amplifying apparatus), and this predistortion type distortion compensation amplifying apparatus comprises a predistortion unit 71 including a variable attenuator (ATT) 81 and a variable phase shifter 82, a power amplifier (PA) 72 composed of one or plural power amplifiers, an envelope detector 73, a compensation table 74 including a table for amplitude control (ATT table) 83 corresponding to the variable attenuator 81 and a table for phase shift control (phase shifter table) 84 corresponding to the variable phase shifter 82, a side band power measuring unit 75, a specific time integrating circuit 76, and a control circuit 77.

An example of operation of the shown predistortion type distortion compensation amplifying apparatus is shown.

The signal entering from the input end of the predistortion type distortion compensation amplifying apparatus is distributed into two signals, and one distribution signal is put into the variable attenuator 81 of the predistortion unit 71, and other distribution signal is put into the envelope detector 73.

The envelope detector 73 detects the envelope information of the input signal (momentary power level), and issues the result of detection to the compensation table 74.

The compensation table 74, referring to the ATT table 83, reads out the control value for amplitude control corresponding to the envelope information entered from the envelope detector 73, and issues the control value to the control terminal of the variable attenuator 81 of the predistortion unit 71 as a control signal for amplitude compensation.

Further, the compensation table 74, referring to the phase shifter table 84, reads out the control value for phase shift control corresponding to the envelope information entered from the envelope detector 73, and issues the control value to the control terminal of the variable phase shifter 82 of the predistortion unit 71 as a control signal for phase shift compensation.

The ATT table 83 and phase shifter table 84 are composed of memories for storing, for example, the envelope information as reference address, and control value corresponding to the reference address. The compensation table 74 reads out the control value corresponding to the address, the address being the envelope information entered from the envelope detector 73, from the ATT table 83 and phase shifter table 84, and issues to the variable attenuator 81 and variable phase shifter 82 of the predistortion unit 71.

The variable attenuator 81 in the predistortion unit 71 attenuates the amplitude of the input signal by the attenuation amount controlled by the control signal entered from the compensation table 74, and issues to the variable phase shifter 82.

The variable phase shifter 82 in the predistortion unit 71 changes (shifts) the phase of the signal entered from the variable attenuator 81 by the phase shift amount controlled by the control signal entered from the compensation table 74, and issues to the power amplifier 72.

Thus, in the predistortion unit 71, the input signal is corrected (compensated) of amplitude or corrected (compensated) of phase depending on the envelope information of the input signal, and the input signal after correction is issued to the power amplifier 72.

The power amplifier 72 amplifies the input signal after predistortion entered from the variable phase shifter 82 of the predistortion unit 71, and issues the amplified signal from the output end of the predistortion type distortion compensation amplifying apparatus.

The side band power measuring unit 75, specific time integrating circuit 76, and control circuit 77 process to optimize the control value to be stored in the ATT table 83 and phase shifter table 84 of the compensation table 74.

Specifically, the side band power measuring unit 75 couples and receives a part of the amplified signal issued from the power amplifier 72 from, for example, the directional coupler, measures the adjacent channel leak power (side band component power) included in the received amplified signal, and issues the measured power to the specific time integrating circuit 76. The component of the adjacent channel leak power includes the distortion component generated in the power amplifier 72.

The specific time integrating circuit 76 integrates the adjacent channel leak power entered from the side band power measuring unit 75 for a predetermined specific time, and issues the integration result to the control circuit 77. Herein, the integration result of the adjacent channel leak power is issued to the control circuit 77, but it may be also designed, for example, to average the adjacent channel leak power issued from the side band power measuring unit 75 for a predetermined specific time, and issue the averaged result to the control circuit 77, and in this case the averaged result corresponds to the average of the integration result in the specific time.

The control circuit 77 updates the control values stored in the ATT table 83 and phase shifter table 84 of the compensation table 74, for example, by the following updating method on the basis of the integration result of the adjacent channel integration result entered from the specific time integrating circuit 76.

The ATT table 83 compares the integration result obtained from the specific time integrating circuit 76 when, for example, part of the control value stored in the ATT table 83 is changed and the distortion is compensated by using the changed control value of the ATT table 83, and the integration result obtained from the specific time integrating circuit 76 when the distortion is compensated by using the control value of the ATT table 83 before the change. The control value of the ATT table 83 in the case of obtaining the smaller integration result of the two integration results compared is used as a more appropriate table value. By repeating such operation, the control value stored in the ATT table 83 is brought closer to an optimum value.

In the phase shifter table 84, by similar operation, the control value stored in the phase shifter table 84 is brought gradually to an optimum value.

Preferably, the control values stored in the ATT table 83 and phase shifter table 84 should be updated so that the integration result obtained in the specific time integrating circuit 76 may be minimum.

Referring now to FIGS. 12(a)–12(e), the principle of compensating the distortion occurring in the amplifier is explained.

FIG. 12(a) shows an example of gain characteristic P1 corresponding to the input signal level (input level) and an example of characteristic Q1 of phase change corresponding to the input level, as the characteristic of the amplifier, in which the axis of abscissas denotes the input level, and the axis of ordinates represents the gain and phase changes. As shown in FIG. 12(a), the gain and phase changes of the amplifier are constant in the linear region of a relatively small input level, but the changes are nonlinear depending on the input level in the nonlinear region where the input level is relatively large.

FIG. 12(b) shows, as the input and output characteristic of the amplifier, an example of characteristic P2 of level (output level) of the output signal corresponding to the input level, and an example of characteristic Q2 of phase (output phase) of the output signal corresponding to the input level. As shown in FIG. 12(b), in the above linear region, the input level and output level are proportional, and the output phase is constant, but in the nonlinear region, the output level and output phase vary nonlinearly depending on the input level. In such amplifier, an amplitude distortion is generated by the nonlinear change of the output level, and a phase distortion is generated by the nonlinear change of the output phase.

On the other hand, FIG. 12(c) shows an example of characteristic P3 of compensation gain corresponding to the input level and an example of characteristic Q3 of compensation phase change corresponding to the input level, as the compensation characteristic for compensating the amplitude distortion and phase distortion occurring in such amplifier, in which the axis of abscissas denotes the input level and the axis of ordinates represents the compensation gain and compensation phase changes. The characteristic P3 of compensation gain and characteristic Q3 of compensation phase change shown in FIG. 12(c) have the characteristic (reverse characteristic) for canceling the gain P1 and phase change Q1 of the amplifier shown in FIG. 12(a), and by applying the compensation gain P3 and compensation phase change Q3 having such reverse characteristic to the signal to be amplified by the amplifier, generally, the amplitude distortion and phase distortion generated in the amplifier can be compensated.

FIG. 12(d) shows an example of characteristic P4 of gain to input level and an example of characteristic Q4 of phase change to input level, as the characteristic in the case of such compensation of amplitude distortion and phase distortion occurring in the amplifier, in which the axis of abscissas denotes the input level and the axis of ordinates represents the gain and compensation phase changes. As shown in FIG. 12 (d), in the characteristic after distortion compensation, if the input level is relatively large, the gain and phase changes are constant.

FIG. 12(e) shows an example of characteristic P5 of output level to input level and an example of characteristic Q5 of output phase to input level, as the input and output characteristic in the case of compensation of amplitude distortion and phase distortion occurring in the amplifier, in which the axis of abscissas denotes the input level and the axis of ordinates represents the output level and output phase. As shown in FIG. 12(e), in the input and output characteristic after distortion compensation, if the input level is relatively large, the output level is proportional to the input level, and the output phase remains invariable.

In this way, to the signal amplified by an amplifier having characteristic g, by giving compensation characteristic f of reverse characteristic of the characteristic g, the distortion of this signal can be compensated.

In the ATT table 83 and phase shifter table 84 of the compensation table 74, control values for realizing such compensation characteristic f are stored.

An example of prior art relating to predistortion is given below.

For example, in the predistortion of the amplifier and the amplifying device disclosed in Japanese Laid-open Patent No. 2000-78037, as a manner of predistorting by preliminarily deforming the input signal of the amplifier, the input signal is deformed by the compensation coefficient corresponding to differential or integral or both values of the input signal, and the adjacent channel leak power is reduced by broadening the signal band, and the frequency characteristic in the base band is improved.

In the predistortion device and its method disclosed in Japanese Laid-open Patent No. 2000-201099, by predistorting by using a predistortion function obtained from the inverse function of the input and output characteristic holding the inclination of small power portion of favorable linearity to the input and output characteristic of the power amplifier, a precise distortion is realized. Specifically, an arbitrary straight line (for example, function y=x) is set as the reference, the predistortion unit is roughly controlled by using table values of two stages and then controlled finely, and the error from the reference is minimized. This publication includes an embodiment in the base band and an embodiment in radio frequency (RF) band.

However, in the predistortion type distortion compensation amplifying apparatus as shown in FIG. 11, since the control value of the compensation table 74 is updated on the basis of the integration result of the adjacent channel leak power observed for a specific time regardless of the level of input signal, when processing a signal, such as CDMA signal, which is large in peak factor of input signal and low in frequency of occurrence of specific input level, the ratio of components corresponding to the input level of such low frequency of occurrence contained in the integration result of adjacent channel leak power is small.

Accordingly, when updating the control value corresponding to the input level of low frequency of occurrence, the density of the adjacent channel leak power component corresponding to such input level is low in the integration result, and the control value of the compensation table 74 cannot be updated to a proper value, or it takes much in convergence into optimum control value, or the control value does not converge.

The invention is devised to solve such problems of the prior arts, and it is hence an object thereof to present a predistortion type distortion compensation apparatus capable of updating the control value to a precise value, when compensating the distortion occurring in an amplifier for amplifying an input signal by controlling by using a control value corresponding to the level of the input signal.

SUMMARY OF THE INVENTION

To achieve the object, in the predistortion type distortion compensation apparatus of the invention, distortion generating means generates distortion in an input signal, input signal level detecting means detects the level of the input signal, and distortion control means controls the distortion generated by the distortion generating means by using a control value corresponding to the level of the input signal detected by the input signal level detecting means, thereby compensating the distortion occurring in the amplifier for amplifying the input signal, in which the control value is updated in the following procedure.

That is, distortion component level detecting means detects the level of distortion component contained in the amplified signal issued from the amplifier, integrating means integrates the level of the distortion component detected by the distortion component detecting means in every level of the input signal detected by the input signal level detecting means, and control value updating means updates the control value corresponding to the level used by the distortion control means so that the integration result of every level of input signal obtained from the integrating means may be small.

Therefore, since the level of the distortion component contained in the amplified signal is integrated at every level of the input signal, and the control value is updated at every level of input signal on the basis of the integration result, the control value for controlling the distortion compensation can be updated to a precise value, so that distortion-compensation of high precision is realized when processing a signal, for example, low in frequency of occurrence of specific input level.

Various signals may be used as the input signal.

Various amplifiers may be used, and either a single amplifier may be used, or plural amplifiers may be combined.

The distortion generating means is preferred to generate both amplitude distortion and phase distortion, but may be designed to generate either.

The level of input signal to be detected by the input signal level detecting means, and the level of distortion component to be detected by the distortion component detecting means are not particularly limited, and, for example, power level and amplitude level may be used.

As the level of distortion component, for example, when transmission signal is used as input signal, the level of adjacent channel leak power may be used.

As the control value for controlling the distortion generated by the distortion generating means, for example, the control value for controlling the amplitude distortion to be generated, or the control value for controlling the phase distortion to be generated may bemused.

As the manner of controlling the amplitude distortion to be generated or the phase distortion to be generated, for example, the quantity of the amplitude distortion to be generated or the quantity of the phase distortion to be generated may be controlled.

As the manner of integrating the level of distortion component at every level of input signal, for example, the level of the distortion component may be integrated by a different integrating circuit at every level of input signal by using plural integrating circuits, or the level of distortion component may be integrated when the input level of a specified level is amplified by using one integrating circuit corresponding to input signal of specific level.

Every level of input signal may be, for example, every level in a specified range, or every level of value of one point. In the invention, therefore, the level of distortion component may be integrated in every specified level range concerning the input signal, or the level of distortion component may be integrated at every level value of one point concerning the input signal.

In the invention, integration of level of distortion component by integrating means includes averaging of the level of distortion component, for example, by integration time or integration counts, and the averaged result substantially corresponds to the quotient of the integration result divided by the integration time or integration counts.

To update the control value corresponding to the level so that the integration result at every level of input signal may be small means specifically to update the control value corresponding to the level range so that the integration result obtained corresponding to the input signal in a certain level range may be small.

The degree of the integration result of distortion component level to be small is preferably minimum, but as far as the distortion is compensated effectively, it may not be always minimum.

Similarly, the degree of compensating the distortion is preferably zero distortion, but as far as the distortion can be decrease effective, it may not be always zero.

Further, in the predistortion type distortion compensation apparatus of the invention, distortion generating means generates distortion in an input signal, input signal level detecting means detects the level of the input signal, and distortion control means controls the distortion generated by the distortion generating means by using a control value corresponding to the level of the input signal detected by the input signal level detecting means, thereby compensating the distortion occurring in the amplifier for amplifying the input signal, in which the control value is updated in the following procedure.

That is, distortion component level detecting means detects the level of distortion component contained in the amplified signal issued from the amplifier, counting means counts inputs at specified level of the level of input signal detected by the input signal level detecting means, integrating means integrates the level of the distortion component detected by the distortion component detecting means when the level of the input signal detected by the input signal level detecting means is the specified level for the period until a specified value is counted by the counting means, and control value updating means updates the control value corresponding to the specified level used by the distortion control means so that the integration result of the integrating means may be small.

Therefore, since the level of the distortion component when the input signal of specified level is amplified is integrated for a period corresponding to the specified count value, and the control value is updated corresponding to the specified level on the basis of the integration result, the control value for controlling the distortion compensation can be updated to a precise value, so that distortion compensation of high precision is realized when processing a signal, for example, low in frequency of occurrence of specific input level.

Herein, various levels may be used as the specified level of input signal, and, for example, a level range may be used or a level value of a point may be used.

As the manner of counting inputs when the input signal level is a specified level, the input times may be counted, for example, by adding +1 to the count value of input of input signals of the specified level, or the input times may be counted by adding +1 to the count value when the input signal of the specified level continues for a predetermined duration, or the input duration may be counted by counting the duration of input of input signal of the specified level.

The specified value to be counted by the counting means may be any value as far as the control value can be updated properly.

Thus, according to the invention, during the period of counting of such specified value by the counting means, the level of the distortion component when the level of the input signal is the specified level is integrated, and the integration result is used in updating of the control value.

In the predistortion type distortion compensation apparatus of the invention, preferably, the distortion control means is composed by using a memory for storing the input signal level and control value in correspondence to each other.

Various memories may be used for this purpose.

This predistortion type distortion compensation apparatus is preferably applied in the radio base station apparatus or radio repeater amplifying device of CDMA system such as W-CDMA system.

Specifically, the CDMA radio base station apparatus in the invention comprises the predistortion type distortion compensation apparatus as described above, and compensates the distortion occurring in the amplifier for amplifying the transmission signal by the predistortion type distortion compensation apparatus.

Further, the CDMA radio repeater amplifying device in the invention comprises the predistortion type distortion compensation apparatus as described above, and compensates the distortion occurring in the amplifier for amplifying the transmission signal by the predistortion type distortion compensation apparatus.

DETAILED DESCRIPTION OF THE PREFERRED EMBODIMENTS

A predistortion type distortion compensation apparatus in a first embodiment of the invention is described below while referring to the accompanying drawings.

Figure 1:
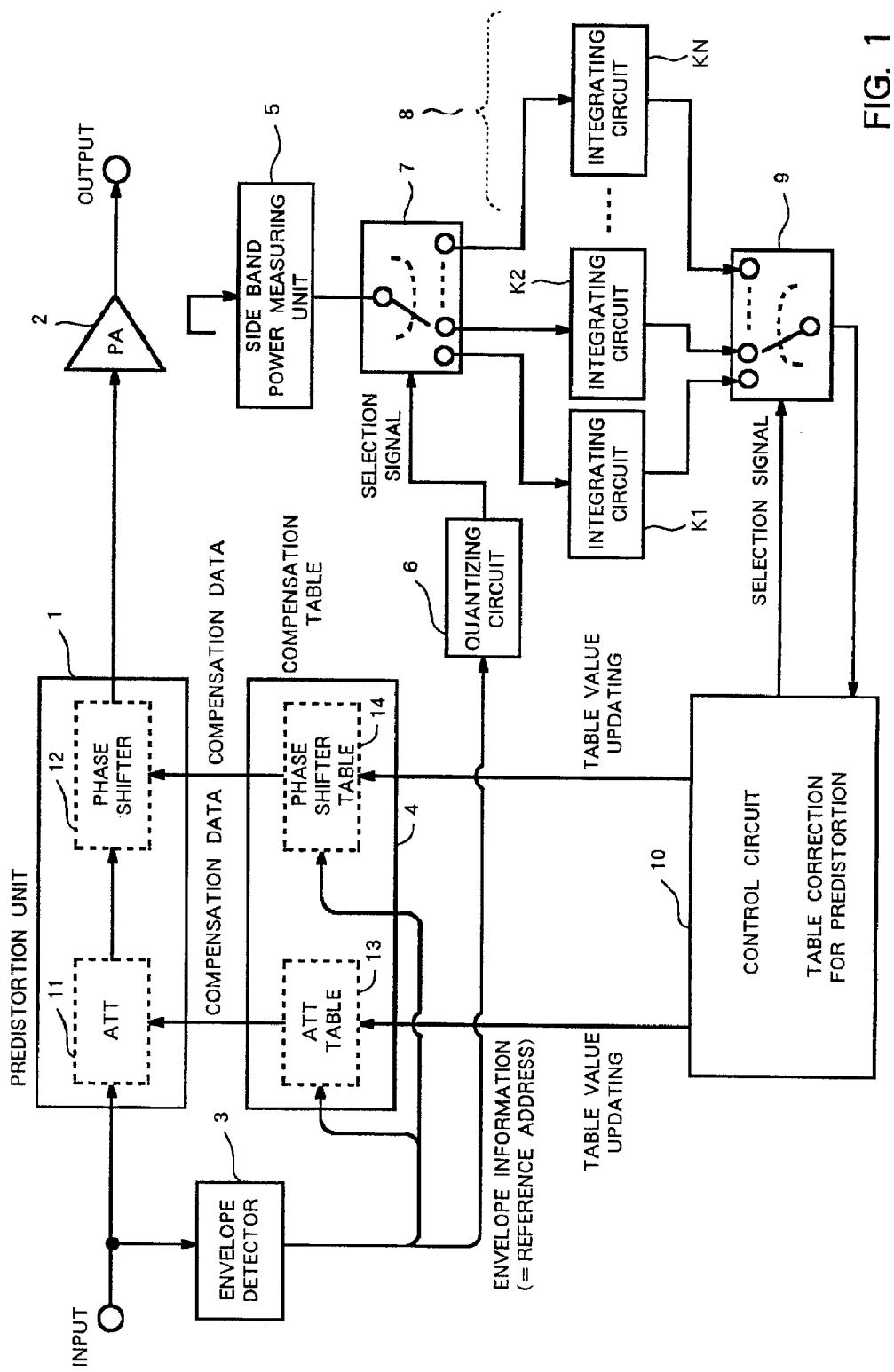
FIG. 1 is a diagram showing a circuit configuration of predistortion type distortion compensation amplifying apparatus in a first embodiment of the invention.

FIG. 1 shows a circuit configuration of the predistortion type distortion compensation amplifying apparatus of the embodiment according to the predistortion type distortion compensation apparatus of the invention, and this predistortion type distortion compensation amplifying apparatus comprises distortion compensation amplifying circuit parts for amplifying the signal by compensating distortion by predistortion system, that is, a predistortion unit 1 including a variable attenuator (ATT) 11 and a variable phase shifter 12, a power amplifying unit (PA) 2 composed of one or plural power amplifiers, an envelope detector 3, and a compensation table 4 including an amplitude control table (ATT table) 13 corresponding to the variable attenuator 11, and a phase control table (phase shifter table) 14 corresponding to the variable phase shifter 12.

The predistortion type distortion compensation amplifying apparatus further comprises control value updating circuit parts for updating the control values stored in the ATT table 13 and phase shifter table 14 of the compensation table 4 by feedback, that is, a side band power measuring unit 5, a quantizing circuit 6, a first selection circuit 7 of one input to multiple outputs, an integrating circuit group 8 composed of N integrating circuits K1 to KN, a second selection circuit 9 of multiple inputs to one output, and a control circuit 10. Herein, N is an arbitrary plural number.

Examples of structure and operation of the distortion compensation amplifying circuit parts are explained below.

Figure 11:
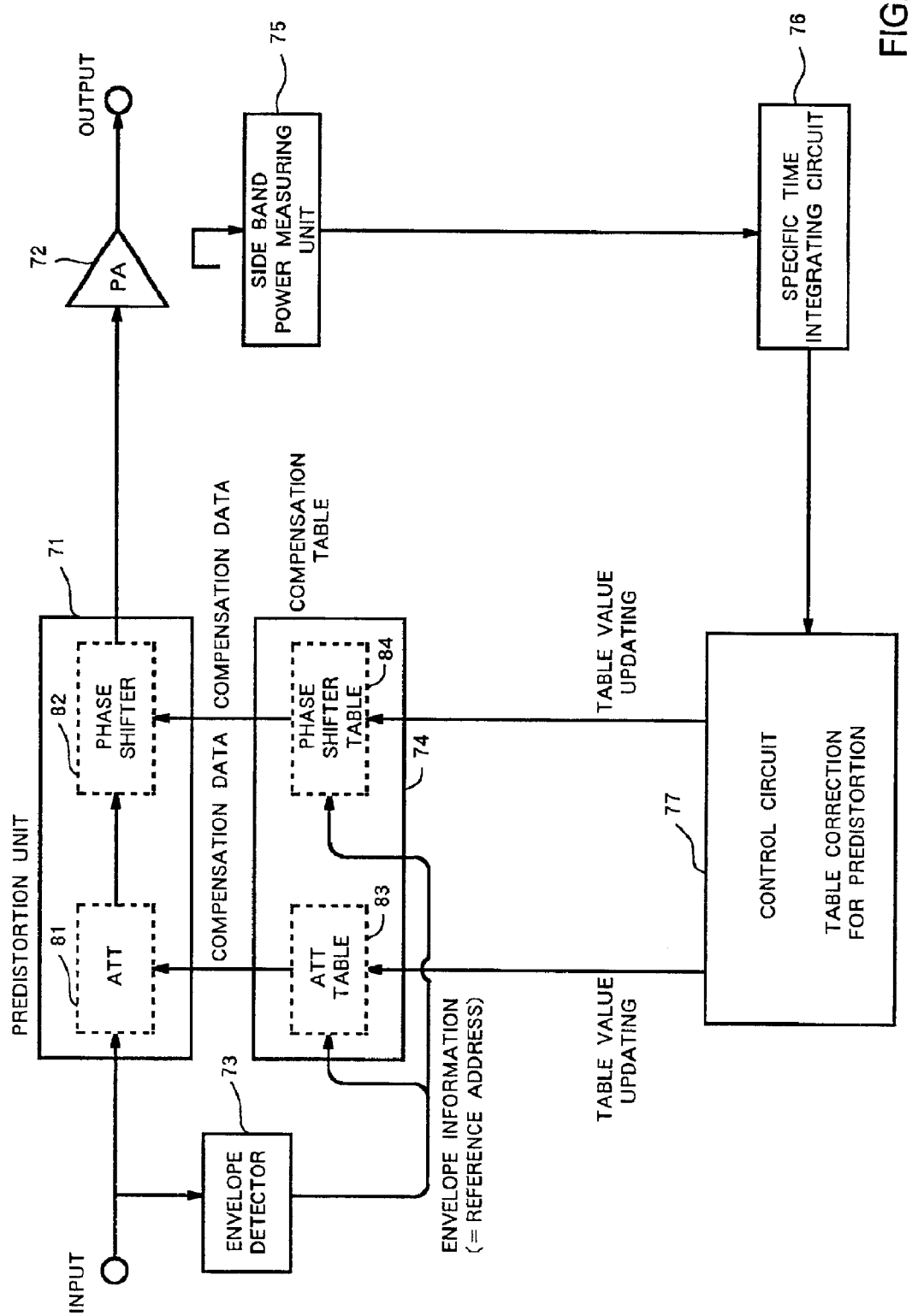
FIG. 11 is a diagram showing a circuit configuration of predistortion type distortion compensation amplifying apparatus.
Figure 12:
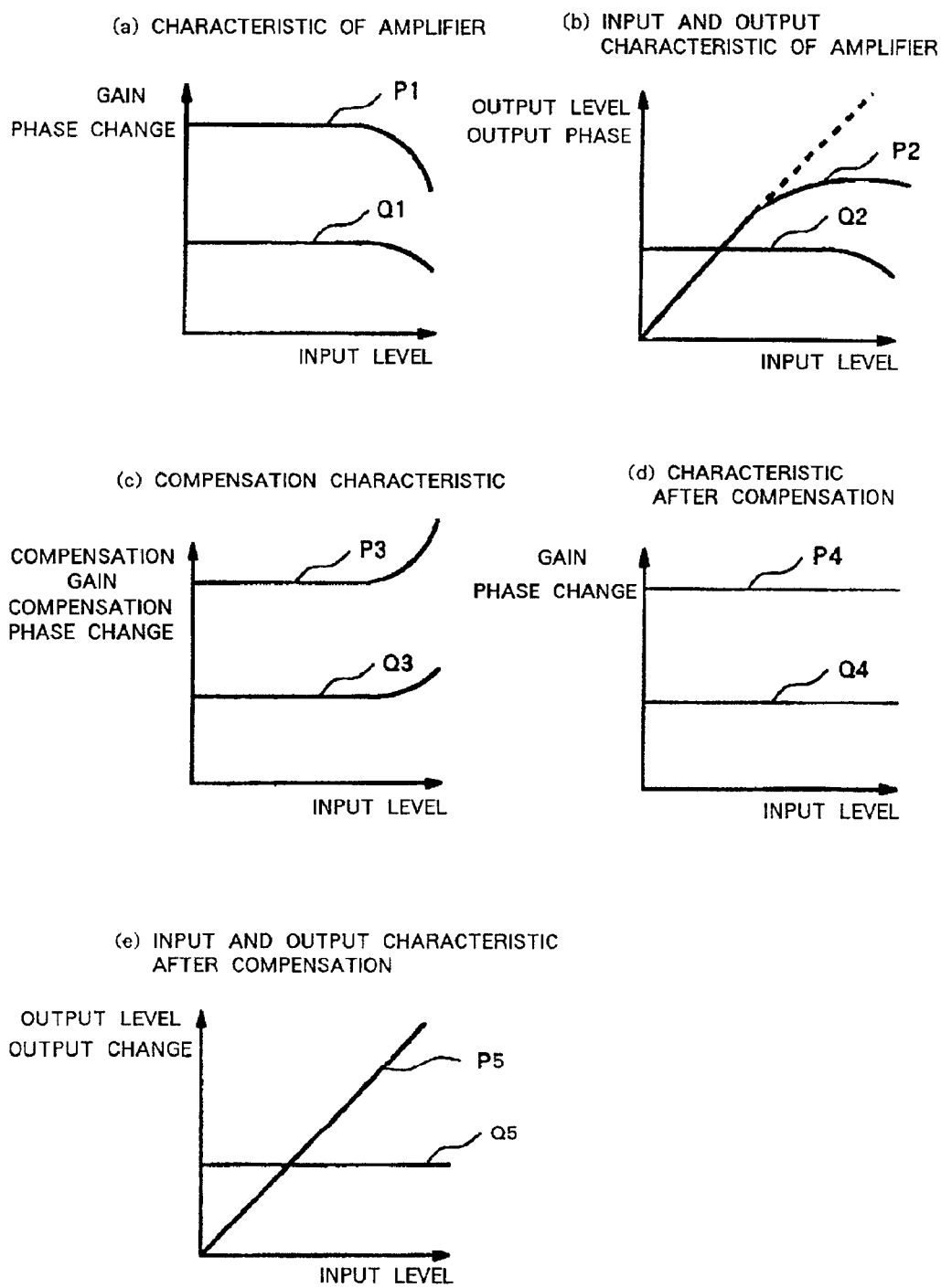
FIGS. 12(a)–12(e) are diagrams for explaining the principle of distortion compensation.

The structure and operation of the distortion compensation amplifying circuit parts of the embodiment are nearly same as shown in FIG. 11.

Specifically, the signal entered from the input end of the predistortion type distortion compensation amplifying apparatus of the embodiment is distributed into two signals, and one distribution signal is put into the variable attenuator 11 of the predistortion unit 1, and other distribution signal is put into the envelope detector 3.

The envelope detector 3 detects the envelope information of input signal (level of momentary power), and issues the detection result into the compensation table 4 and quantizing circuit 6.

The compensation table 4, referring to the ATT table 13, reads out the control value for amplitude control corresponding to the envelope information entered from the envelope detector 3, and issues the control value to the control terminal of the variable attenuator 11 of the predistortion unit 1 as a control signal for amplitude compensation.

Further, the compensation table 4, referring to the phase shifter table 14, reads out the control value for phase shift control corresponding to the envelope information entered from the envelope detector 3, and issues the control value to the control terminal of the variable phase shifter 12 of the predistortion unit 1 as a control signal for phase shift compensation.

The ATT table 13 and phase shifter table 14 are composed of memories for storing, for example, the envelope information as reference address, and control value corresponding to the reference address. The compensation table 4 reads out the control value corresponding to the address, the address being the envelope information entered from the envelope detector 13, from the ATT table 13 and phase shifter table 14, and issues to the variable attenuator 11 and variable phase shifter 12 of the predistortion unit 1.

The variable attenuator 11 in the predistortion unit 1 attenuates the amplitude of the input signal by the attenuation amount controlled by the control signal entered from the compensation table 4, and issues to the variable phase shifter 12.

The variable phase shifter 12 in the predistortion unit 1 changes (shifts) the phase of the signal entered from the variable attenuator 11 by the phase shift amount controlled by the control signal entered from the compensation table 4, and issues to the power amplifier 2.

Thus, in the predistortion unit 1, the input signal is corrected (compensated) of amplitude or corrected (compensated) of phase depending on the envelope information of the input signal, and the input signal after correction is issued to the power amplifier 2.

The power amplifier 2 amplifies the input signal after predistortion entered from the variable phase shifter 12 of the predistortion unit 1, and issues the amplified signal from the output end of the predistortion type distortion compensation amplifying apparatus of the embodiment.

Examples of structure and operation of the control value updating circuit parts are explained.

In the embodiment, the control value updating circuit parts include a plurality of integrating circuits K1 to KN for integrating the measured adjacent channel leak power, and the first selection circuit 7 of one input to multiple outputs is disposed at the input side of the integrating circuit group 8 composed of these N integrating circuits K1 to KN, and the second selection circuit 9 of multiple inputs to one output is disposed at the output side of the integrating circuit group 8. The first selection circuit 7 receives a digital value issued from the quantizing circuit 6 at its control terminal, and controls it, and the second selection circuit 9 receives a selection signal issued from the control circuit 10 at its control terminal, and controls it.

Specifically, the side band power measuring unit 5 couples and receives a part of the amplified signal issued from the power amplifier 2 from, for example, a directional coupler, measures the adjacent channel leak power (side band component power) included in the received amplified signal, and issues the measured power to the first selection circuit 7. The component of the adjacent channel leak power includes the distortion component generated in the power amplifier 2.

The quantizing circuit 6 converts the envelope information entered from the envelope detector 3 into a digital value, and sends the converted digital value into the control terminal of the first selection circuit 7.

The first selection circuit 7 receives the adjacent channel leak power entered from the side band power measuring unit 5, and selects and changes over one integrating circuit from the N integrating circuits K1 to KN as the output destination of the adjacent channel leak power depending on the digital value entered from the quantizing circuit 6.

In this embodiment, corresponding to N integrating circuits K1 to KN, different level ranges of input signals are predetermined. The first selection signal 7 selects the integrating circuit set in the level range including the level of the input signal corresponding to the digital value, depending on the digital value entered from the quantizing circuit 6, and changes over the output destination of the adjacent channel leak power to this integrating circuit.

Each one of the integrating circuits K1 to KN integrates the adjacent channel leak power entered from the first selection circuit 7, and issues the integration result to the second selection circuit 9. Herein, the integration result of the adjacent channel leak power is issued to the control circuit 10 through the second selection circuit 9, but it may be also designed, for example, to average the adjacent channel leak power issued from the first selection circuit 7, and issue the averaged result to the control circuit 10 through the second selection circuit 9.

The second selection circuit 9 is controlled, for example, by the selection signal entered from the control circuit 10, and selects one integrating circuit from N integrating circuits K1 to KN, and changes over to issue the obtained integration result to the control circuit 10 from the selected integrating circuit.

The control circuit 10 issues a selection signal to the control terminal of the second selection circuit and controls the second selection circuit 9, so that only the integration result by the integrating circuit set in the level range including the input signal level corresponding to the control value of the compensation table 4 to be updated is selected and entered into the control circuit 10. The control circuit 190 also manages the period of continuous integration, for example, in every one of the integrating circuits K1 to KN.

In this way, the integration result of adjacent channel leak power classified in every level range of input signals is entered in the control circuit 10 from the integrating circuits K1 to KN. In the control circuit 10, the integration time of obtaining the integration results entered from the integrating circuits K1 to KN is known.

In this embodiment, the control circuit 10 controls the second selection circuit 9 at an arbitrary timing to receive the integration result, but alternatively, for example, the timing may be deviated in each one of the integrating circuits K1 to KN by measuring the specified period in each one of the integrating circuits K1 to KN, selecting the second selection circuit 9 at the timing of measuring the specified period, and issuing the integration result obtained from the integrating circuits K1 to KN to the control circuit 10 through the second selection circuit 9.

Or, by monitoring the adjacent channel leak power entered into the integrating circuits K1 to KN or accumulated integrated value, the second selection circuit 9 is controlled when the adjacent channel leak power or integral value exceeds a specified threshold, and the integration result obtained from the integrating circuit exceeding the threshold may be issued to the control circuit 10 through the second selection circuit 9.

The control circuit 10 updates the control values stored in the ATT table 13 and phase shifter table 14 of the compensation table 4, for example, by the following updating method on the basis of the integration result of the adjacent channel integration result entered from the second selection circuit 9.

The ATT table 13 compares the integration result obtained by executing distortion compensation by using the control value of the ATT table 13 changed by changing part of the control value stored in the ATT table 13, and the integration result obtained by executing distortion compensation by using the control value of the ATT table 13 before the change, concerning the table portion corresponding to the level range of the input signal set in the integrating circuit acquiring the integration result. Of the two integration results compared, in the smaller integration result, the control value of the ATT table 13 is employed as a more adequate table value. By repeating this operation, the control value stored in the ATT table 13 is brought closer to an optimum value.

In the phase shifter table 14, by similar operation, the control value stored in the phase shifter table 14 is brought gradually to an optimum value.

Preferably, the control values stored in the ATT table 13 and phase shifter table 14 should be updated so that the integration result obtained in the individual integrating circuits K1 to KN may be minimum.

Figure 2:
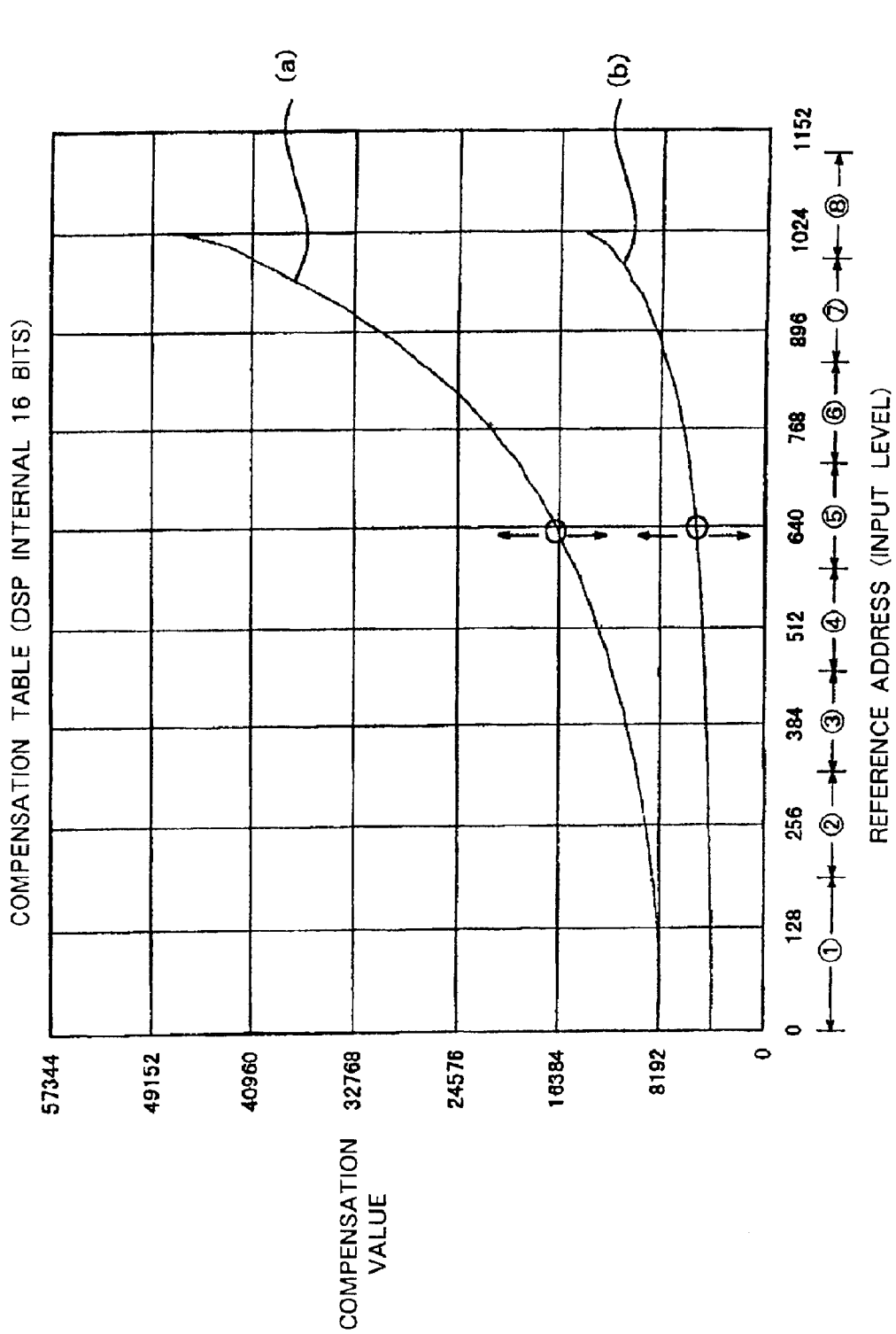
FIG. 2 is a diagram showing an example of correspondence of reference address and compensation value.

FIG. 2 shows an example (a) of compensation value of amplitude distortion realized by the ATT table 13 of the compensation table 4 of the embodiment, and an example (b) of compensation value of phase distortion realized by the phase shifter table 14. In the diagram, the axis of abscissas denotes the reference address of the ATT table 13 and phase shifter table 14, and the axis of ordinates represents the compensation value. The reference address corresponds to the level of input signal. Herein, the compensation table 4 is composed by using 16 bits in the DSP.

As shown in the diagram, concerning the compensation value of amplitude distortion, the gain as the compensation value is determined depending on the reference address corresponding to the level of input signal, and the control value for realizing this gain is stored in the ATT table 13 corresponding to the reference address. In this embodiment, the attenuation amount of the variable attenuator 11 corresponds to the gain as the compensation value.

Similarly, in the diagram, concerning the compensation value of phase distortion, the phase change as the compensation value is determined depending on the reference address corresponding to the level of input signal, and the control value for realizing this phase change is stored in the phase shifter table 14 corresponding to the reference address. In this embodiment, the phase shift amount of the variable phase shifter 12 corresponds to the phase change as the compensation value.

In the diagram, further, the reference address corresponding to the level of input signal is classified in eight level ranges 1 to 8 at equal intervals, and the number N of integrating circuits K1 to KN provided in the integrating circuit group 8 is 8 in this case, and level ranges 1 to 8 are assigned to the integrating circuits K1 to KN. In the integrating circuits K1 to KN, the adjacent channel leak power corresponding to the input signal level included in the level range is integrated in each one of level ranges 1 to 8.

In the case of software programming or processing, meanwhile, it is preferred to divide the levels by the power of 2, such as 8 levels, because programming and arithmetic processing can be done easily. Aside from 8 levels, the range may be further divided into 16 levels, and the control value may be updated more accurately.

For example, in the steep portion of compensation value depending on the reference address corresponding to the level of input signal, by classifying the level range more finely as compared with other portion, the control value may be updated more accurately. In the shown example, specifically, it is preferred to classify more finely at the reference address of about 768 to 1024.

Thus, in the predistortion type distortion compensation amplifying apparatus of the invention, when amplifying by the power amplifier 2 by predistorting the input signal by using the control value corresponding to the level of the input signal, the adjacent channel leak power included in the amplified signal is integrated in different integrating circuits K1 to KN at every level of the input signal, and one integrating circuit is selected from the plural integrating circuits K1 to KN depending on the input signal level corresponding to the control value to be updated, so that the control value may be updated on the basis of the integration result obtained from this integrating circuit.

Therefore, only the component depending on the level range of the input signal corresponding to the control value is included in the integration result of the adjacent channel leak power used in updating of control value, while component depending on other level range is not included, that is, the component depending on the level range not related to the level range of the input signal corresponding to the control value to be updated is not included, so that the control value may be updated to the optimum value accurately and smoothly.

In this embodiment, the distortion generating means is composed by the function of the variable attenuator 11 and variable phase shifter 12 of the predistortion unit 1 for generating amplitude distortion and phase distortion in the input signal.

Also in the embodiment, the input signal level detecting means is composed by the function of the envelope detector 3 for detecting the level of input signal.

In the embodiment, further, the distortion control means is composed by the function of the compensation table 4 for controlling the amplitude distortion and phase distortion for generating the input signal by using the control signal corresponding to the level of the input signal. In the embodiment, the distortion control means is composed by using the memory for storing the level of input signal and control value in correspondence to each other.

In the embodiment, the power amplifier 2 corresponds to the power amplifier as the object of distortion compensation.

Also in the embodiment, the distortion component level detecting means is composed by the function of the side band power measuring unit 5 for detecting the adjacent channel leak power included in the amplified signal issued from the power amplifier 2 as the level of distortion component.

In the embodiment, the integrating means is composed by the function of the plural integrating circuits K1 to KN for integrating the level of the distortion component at every level of input signal by selection and changeover by the first selection circuit 7.

Further, in the embodiment, the control value updating means is composed by the function of the control circuit 10 for updating the control value of the compensation table 4 corresponding to the level so that the integration result at every level of input signal may be small by selection and changeover by the second selection circuit 9.

Figure 3:
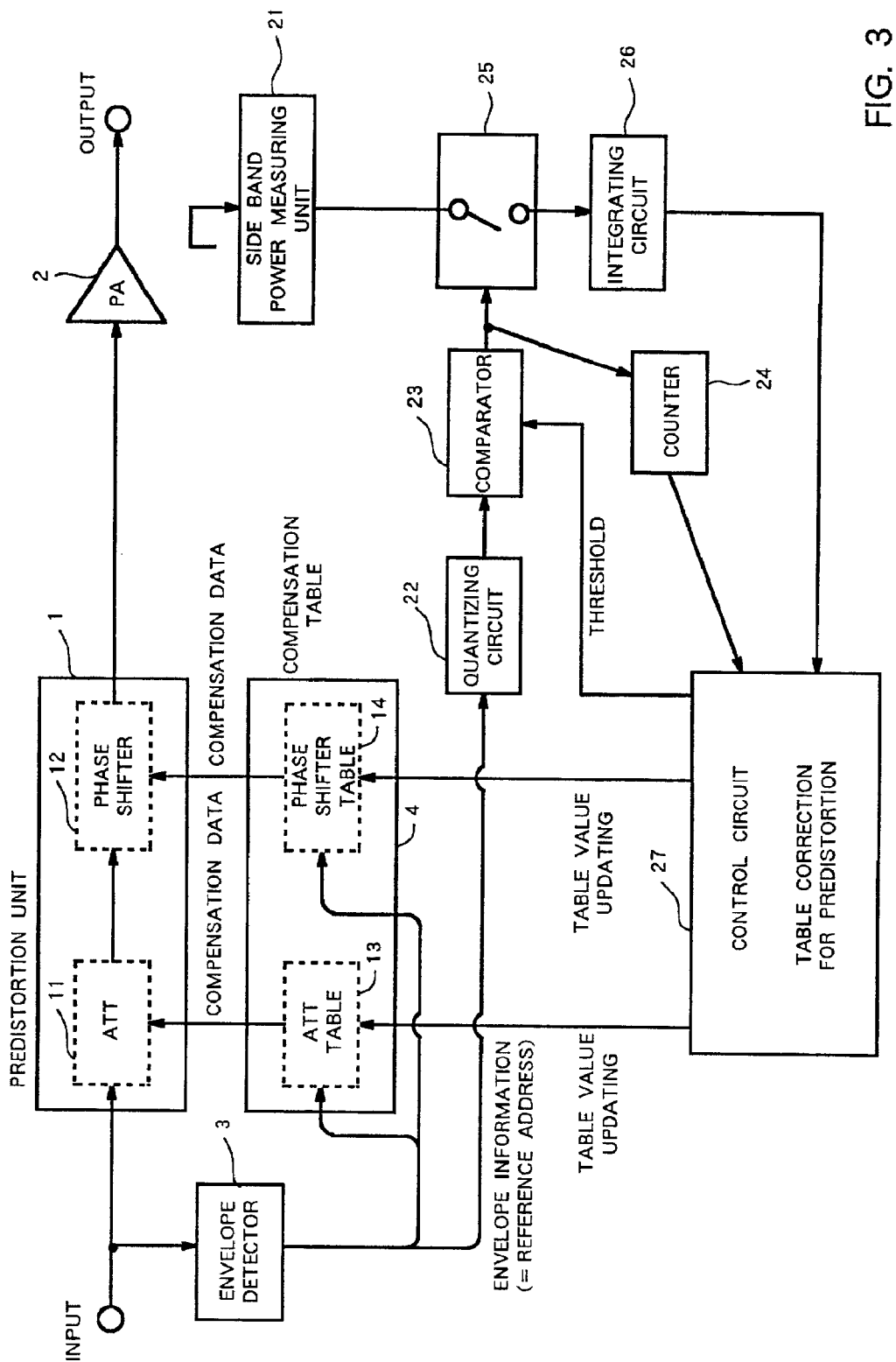
FIG. 3 is a diagram showing a circuit configuration of predistortion type distortion compensation amplifying apparatus in a second embodiment of the invention.

Referring now to FIG. 3, a predistortion type distortion compensation amplifying apparatus in a second embodiment of the invention is explained.

The diagram shows a circuit configuration of the predistortion type distortion compensation amplifying apparatus of the embodiment, and this predistortion type distortion compensation amplifying apparatus comprises the same distortion compensation amplifying circuit parts of the first embodiment as shown in FIG. 1, and different control value updating circuit parts.

Specifically, the distortion compensation amplifying circuit parts of the embodiment comprise a predistortion unit 1 including a variable attenuator (ATT) 11 and a variable phase shifter 12, a power amplifying unit (PA) 2 composed of one or plural power amplifiers, an envelope detector 3, and a compensation table 4 including an amplitude control table (ATT table) 13 corresponding to the variable attenuator 11, and a phase control table (phase shifter table) 14 corresponding to the variable phase shifter 12. These components 1 to 4, 11 to 14 are same as in the first embodiment shown in FIG. 1, and same reference numerals are given herein for the sake of convenience of explanation.

The control value updating circuit parts of the embodiment comprise a side band power measuring unit 21, a quantizing circuit 22, a comparator 23, a counter 24, a changeover circuit 25, an integrating circuit 26, and a control circuit 27.

Omitting the explanation of same parts as in the first embodiment shown in FIG. 1, examples of structure and operation of the control value updating circuit parts which are characteristic of the embodiment are specifically described below.

The side band power measuring unit 21 couples and receives a part of the amplified signal issued from the power amplifier 2 from, for example, a directional coupler, measures the adjacent channel leak power (side band component power) included in the received amplified signal, and issues the measured power to the changeover circuit 25. The component of the adjacent channel leak power includes the distortion component generated in the power amplifier 2.

The quantizing circuit 22 converts the envelope information entered from the envelope detector 3 into a digital value, and sends the converted digital value into the comparator 23.

The comparator 23 judges if the level of the input signal corresponding to the digital value entered from the quantizing circuit 22 is included or not in the level range on the basis of the threshold information entered from the control circuit 27, and if judging to be included, sends a specified ON signal to the control terminal of the changeover circuit 25 and the counter 24, and if judged not to be included, sends a specified OFF signal to the control terminal of the changeover circuit 25 and the counter 24. Herein, from the control circuit 27 to the comparator 23, for example, the threshold information for specifying the upper limit and lower limit of the level range including the input signal level corresponding to the control value to be updated is issued.

The counter 24 has a function of counting the count value, and every time an ON signal is entered from the comparator 23, the count value is increased by +1, and the count value is noticed to the control circuit 27.

The changeover circuit 25 closes the switch when an ON signal is entered from the comparator 23, and issues the adjacent channel leak power entered from the side band power measuring unit 21 into the integrating circuit 26, and opens the circuit when an OFF signal is entered from the comparator 23, and does not issue the adjacent channel leak power entered from the side band power measuring unit 21 into the integrating circuit 26.

The integrating circuit 26 integrates the adjacent channel leak power entered from the changeover circuit 25, and sends the integration result to the control circuit 27.

The control circuit 27 sends such threshold information to the comparator 23, and integrates the adjacent channel leak power corresponding to the input signal of the level range on the basis of the threshold information by the integrating circuit 26. Thus, depending on the threshold information, integration result of the adjacent channel leak power classified in every level range of the input signal is entered into the control circuit 27.

Further, the control circuit 27 receives the count value of the counter 24, and the adjacent channel leak power corresponding to the input signal in the level range on the basis of the threshold information is entered into the integrating circuit 26, and the number of times of integration is known. The number of times corresponds to the count value of the counter 24.

On the basis of the integration result of the adjacent channel leak power entered from the integrating circuit 26, the control circuit 27 updates the control values stored in the ATT table 13 and phase shifter table 14 of the compensation table 4. The control circuit 27 can also reset the count value of the counter 24 to zero, as required, or change the threshold value to be issued to the comparator 23.

In the embodiment, when the count value of the counter 24 reaches a specified value, the control circuit 27 acquires the integration result by the integrating circuit 26, and updates the control value on the basis of the integration result, but it may be also composed to update the control value depending on the input of the integration result by the control circuit 27, by further comprising means for operating the integrating circuit 26 when the count value of the counter 24 reaches the specified value, for example, and issuing the integration result from the integrating circuit 26 to the control circuit 27.

Thus, in the predistortion type distortion compensation amplifying apparatus of the embodiment, when predistorting the input signal by using the control value corresponding to the level of the input signal and amplifying in the power amplifier 2, the number of times of input of the input signal of the specified level is counted by the counter 24 in every level range of the input signal corresponding to the control value to be updated, and when the count value of the counter 24 reaches the specified value, the integration result of adjacent channel leak power by the integrating circuit 26 is acquired from the control circuit 27, and the control value is updated on the basis of the integration result.

Therefore, only the component depending on the level range of the input signal corresponding to the control value is included in the integration result of the adjacent channel s leak power used in updating of control value, while component depending on other level range is not included, that is, the component depending on the level range not related to the level range of the input signal corresponding to the control value to be updated is not included, so that the control value may be updated to the optimum value accurately and smoothly.

In the embodiment, the distortion component level detecting means is composed by the function of the side band power measuring unit 21 for detecting the adjacent channel leak power included in the amplified signal issued from the power amplifier 2 as the level of distortion component.

Also in the embodiment, the counting means is composed by the function of the counter 24 for counting inputs when the level of input signal is the specified level on the basis of the ON signal from the comparator 23.

Further, in the embodiment, the integrating means is composed by the function of the integrating circuit 26 for integrating the adjacent channel leak power when the input signal level changed over by the changeover circuit 25 is the specified level as the level of distortion component for the period until the specified value is counted by the counter 24.

In the embodiment, moreover, the control value updating means is composed by the function of the control circuit 27 for updating the control value of the compensation table 4 corresponding to the specified input signal level so that the integration result by the integrating circuit 26 may be small.

A base station apparatus according to a third embodiment of the invention is explained below by referring to the drawings.

The embodiment relates to an example of a base station apparatus for making radio communication with a mobile station apparatus conforming to CDMA system such as W-CDMA system.

The base station apparatus of the embodiment is roughly composed of the MDE section (wireless modulation and demodulation section) for processing and controlling signals, and the amplifier section having common amplifiers (C-AMP).

Figure 4:
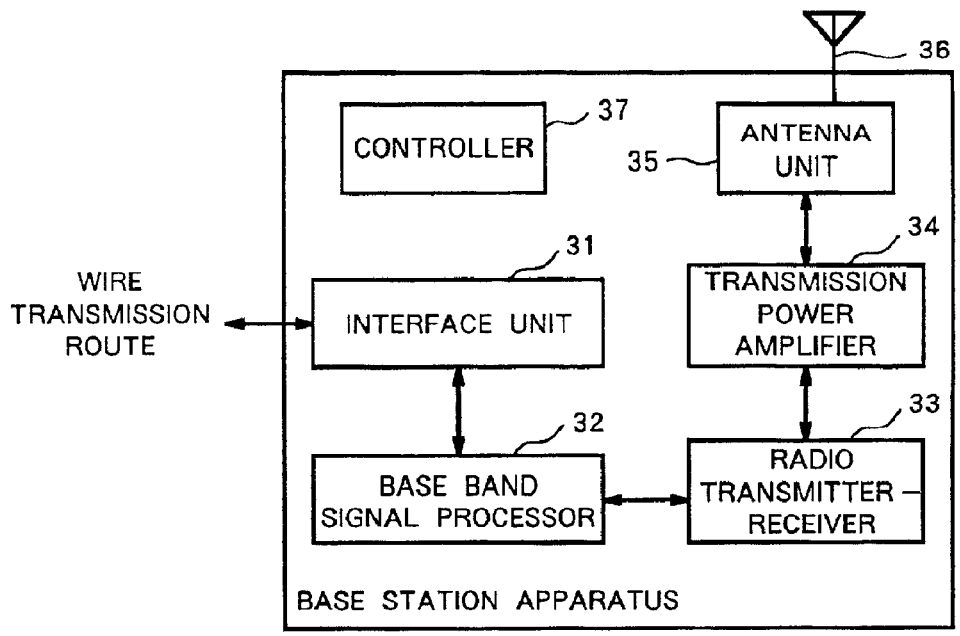
FIG. 4 is a schematic block diagram of a base station apparatus in a third embodiment of the invention.

FIG. 4 shows a schematic structural example of the base station apparatus of the embodiment.

As shown in the diagram, the base station apparatus of the invention comprises an interface unit 31 for communicating signals with other base station apparatus or the like, for example, through wired transmission route, a base band signal processing unit 32 for processing a base band signal, a radio transmitter-receiver 33 for transmitting and receiving signals in radio frequency band, a transmission power amplifying unit 34 for amplifying a transmission signal by an amplifier having a same distortion compensation function as the predistortion type distortion compensation amplifying apparatus, for example, as in the first embodiment and second embodiment, an antenna unit 34 for transmitting and receiving radio signals by using an antenna 36, the antenna 36, and a controller 37 for controlling various processings executed in these components 31 to 36.

In the embodiment, the MDE section is composed of, for example, the interface unit 31, base band signal processing unit 32, radio transmitter-receiver 33, and controller 37, and the amplifying unit is composed of, for example, the transmission power amplifier 34.

An example of processing by the base station apparatus of the embodiment is explained below.

That is, in transmission process, for example, the signal received through the wired transmission route from other base station apparatus from the interface unit 31 is processed in the base band processing unit 32, and converted into a radio frequency band signal in the radio transmitter-receiver 33, and this radio frequency band signal (transmission signal) is amplified by the transmission power amplifier 34, and the amplified signal is radio transmitted to a mobile station apparatus from the antenna 36 by the antenna unit 35.

In the reception process, for example, the signal radio transmitted from the mobile station apparatus or the like is received in the antenna unit 35 through the antenna 36, and the received signal is processed in the radio transmitter-receiver 33, and is processed in the base band signal processing unit 32, and the received signal is transmitted to other baser station apparatus through the wired transmission route by the interface unit 31.

Thus, according to the base station apparatus of the invention, since the distortion occurring in the amplifier is compensated by comprising the distortion compensation function same as in the predistortion type distortion compensation amplifying apparatus as in the first embodiment or second embodiment, the control value used in distortion compensation can be updated to an optimum value accurately and smoothly same as mentioned in the first embodiment or second embodiment.

The predistortion type distortion compensation apparatus of the invention is particularly effective when applied in the amplifier for processing multi-channel signals, such as the transmission signal amplifier or common amplifier provided, for example, in the W-CDMA base station apparatus, and the invention may be also applied in the base station apparatus conforming to other communication system such as TDMA (time division multiple access) system or FDMA (frequency division multiple access) system.

In the base station apparatus of the embodiment, preferably, it is designed to amplify the transmission signal by the common amplifier by using the distortion compensation function of the invention, and an structural example of the amplifying unit using such common amplifier is explained in comparison with a structural example of amplifying unit using an ordinary amplifier (herein, an amplifier not being a common amplifier).

Figure 5:
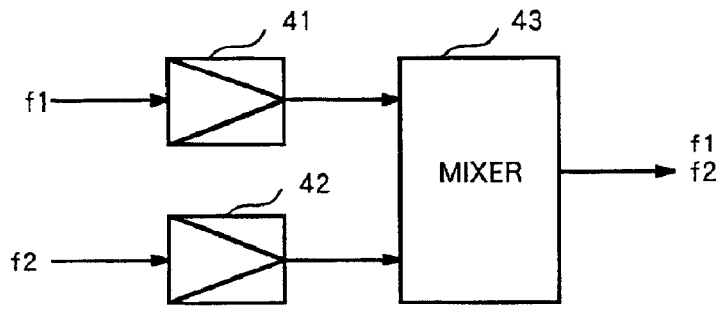
FIG. 5 is a diagram showing a structural example of an amplifier for amplifying individually.

FIG. 5 shows a structural example of an amplifying unit using an ordinary amplifier (an amplifying unit for amplifying individually), and this amplifying unit amplifies signals of different frequencies, for example, f1 and f2 individually at each frequency, and combines the amplitude signals at frequencies f1, f2. More specifically, the signal at frequency f1 is amplified by an amplifier 41, and other signal at frequency f2 is amplified by other amplifier 42, and the two amplified signals are combined in a mixer 43. In the amplifiers 41, 42, distortion is generated due to their nonlinearity (adjacent channel leak power).

In such amplifying unit, since a wide band is combined, a loss of 3 dB is generated each in the signal of frequencies f1, f2 in the mixer 43. Therefore, when the mixer 43 issues signals of frequencies f1 and f2, for example, at P [W], the amplifiers 41, 42 must issue by amplifying the signals at frequencies f1, f2 to 2P [W], and the amplifier efficiency is lowered to ½ that of the independent operation.

Figure 6:
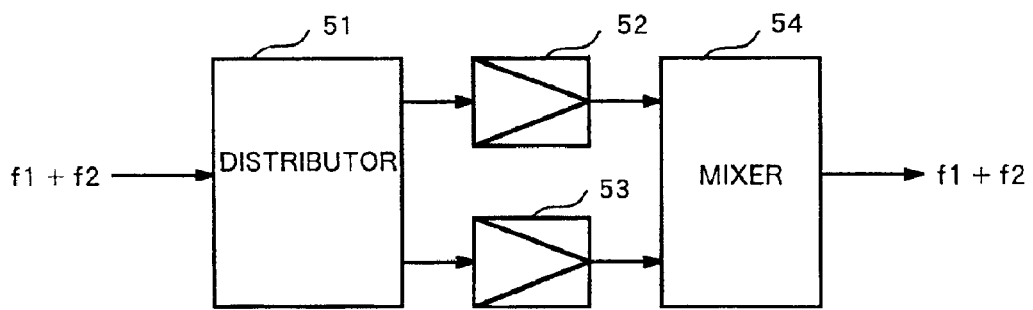
FIG. 6 is a diagram showing a structural example of an amplifier for amplifying commonly.
Figure 7:
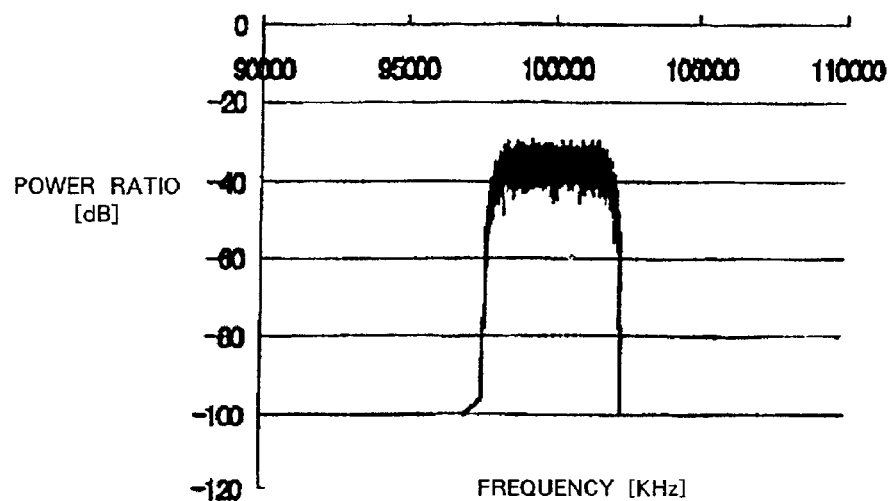
FIG. 7 is a diagram showing an example of spectrum of transmission signal before input into an amplifier.
Figure 8:
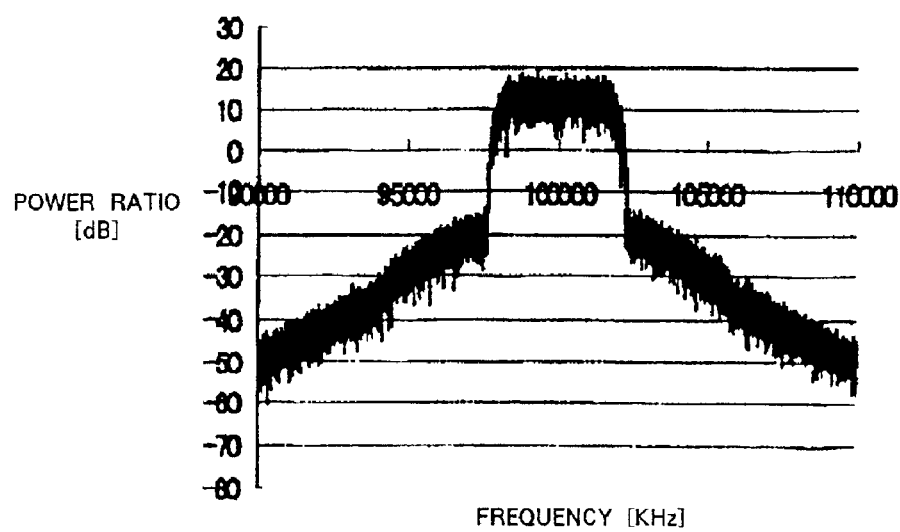
FIG. 8 is a diagram showing an example of spectrum of transmission signal amplified and issued from an amplifier without distortion compensation.
Figure 9:
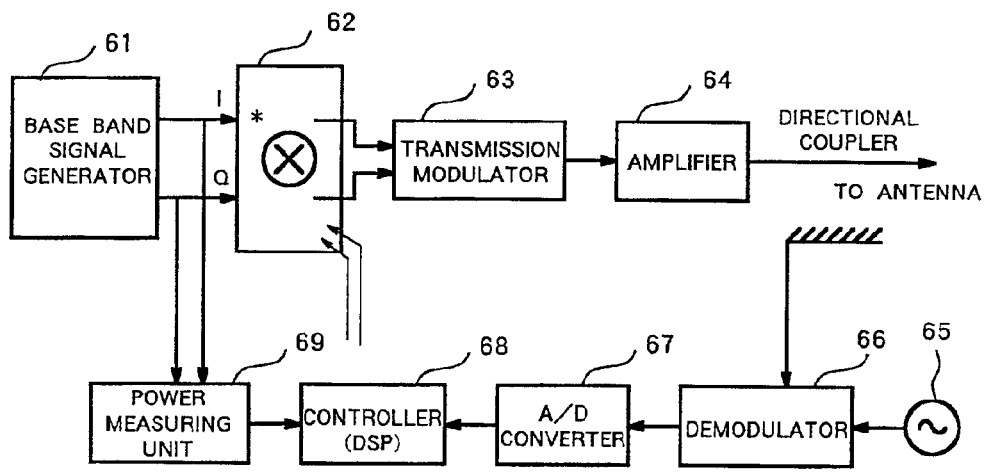
FIG. 9 is a block diagram of transmission power amplifier with distortion compensation in a prior art.
Figure 10:
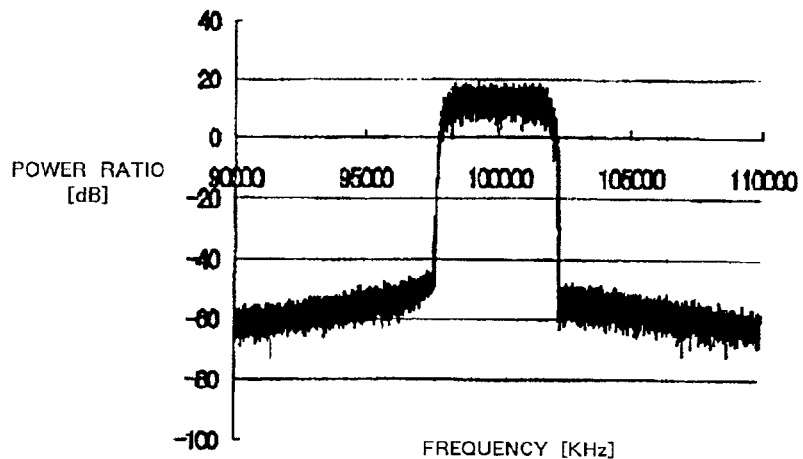
FIG. 10 is a diagram showing an example of spectrum of transmission signal amplified and issued from an amplifier by distortion compensation.

On the other hand, FIG. 6 shows a structural example of an amplifying unit using a common amplifier (an amplifying unit for amplifying commonly), and this amplifying unit amplifies plural signals of different frequencies, for example, f1 and f2 together (amplifying commonly). That is, in the amplifying unit shown in FIG. 6, for example, a combined signal of two signals at different frequencies f1, f2 is equally distributed by a distributor 51 (distributed not by frequency but by, for example, power), and each distribution signal is amplified by common amplifiers 52, 53, and combined in a mixer 54. In the common amplifiers 52, 53, distortion is generated due to their nonlinearity (adjacent channel leak power), and also cross modulation distortion is generated by the two signals at different frequencies f1, f2.

In such amplifying unit, for example, two outputs from the common amplifiers 52, 53 are combined parallel as mentioned above. In such parallel combination, a same signal is combined, and unlike the amplifying unit shown in FIG. 5, combination loss does not occur. Therefore, when the combined signal of two frequencies f1, f2 is issued from the mixer 54 at P [W], the common amplifiers 52, 53 issue the combined signal at two frequencies f1, f2 only by amplifying to P [W], and the amplifier efficiency is superior as compared with the amplifying unit shown in FIG. 5.

The third embodiment relates to an example of CDMA radio station apparatus for compensating the distortion occurring in the amplifier for amplifying the transmission signal by the predistortion type distortion compensation apparatus, but a CDMA radio repeater amplifying apparatus for compensating the distortion occurring in the amplifier for amplifying the transmission signal by the predistortion type distortion compensation apparatus may be also composed.

The structure of the predistortion type distortion compensation apparatus is not limited to the illustrated examples alone, but it may be realized in other various forms.

The application field of the invention is not limited to the illustrated examples alone, but the invention may be applied in various fields.

For example, the application field of the predistortion type distortion compensation apparatus of the invention is not limited to the base station apparatus or repeater amplifying apparatus, but it includes various fields such as mobile station devices for compensating the distortion occurring in amplifiers. Such mobile station devices include cellular phone terminal device, PHS (personal handyphone system) terminal device, and others.

The technical concept of the predistortion type distortion compensation apparatus of the invention may be also applied to the distortion compensation apparatus for compensating the distortion occurring in the amplifier by generating reverse distortion of the distortion occurring in the amplifier in the signal issued from the amplifier, for example, by a distortion unit with the distortion unit provided at the output side of the amplifier.

Various processes done by the predistortion type distortion compensation apparatus of the invention include control by executing a control program stored in the ROM by the processor in the hardware resource having the processor, memory and others, or functional means for executing the process may be composed as independent hardware circuit.

The invention may be also understood as the computer-readable recording medium or the program (itself) such as the floppy disk or CD-ROM storing such control program, and the process of the invention may be executed by executing the control program by the processor by putting into the computer from the recording medium.

INDUSTRIAL APPLICABILITY

As described herein, according to the predistortion type distortion compensation apparatus of the invention, in the mechanism for compensating the distortion occurring in the amplifier for amplifying the input signal by controlling the distortion generated in the input signal by using the control value corresponding to the detection result of the level of the input signal, the level of the distortion component included in the amplified signal issued from the amplifier is detected, the level of the distortion component detected at every level of the detected input signal is integrated, and the control value is updated corresponding to the level used in distortion control so that the integration result may be small at every level of the input signal, and therefore the control value for controlling distortion compensation may be updated to a value of higher precision, and even in the case of processing signals low in frequency of occurrence of a specific input level, distortion compensation of high precision is realized.

Also, according to the predistortion type distortion compensation apparatus of the invention, in the mechanism for compensating the distortion occurring in the amplifier for amplifying the input signal by controlling the distortion generated in the input signal by using the control value corresponding to the detection result of the level of the input signal, the level of the distortion component included in the amplified signal issued from the amplifier is detected, inputs are counted when the level of the detected input signal is the specified level, the level of the detected distortion component is integrated when the level of the detected input signal is the specified level for the period until the specified value is counted, and the control value is updated corresponding to the level used in distortion control so that the integration result may be small, and therefore the control value for controlling distortion compensation may be updated to a value of higher precision, and even in the case of processing signals low in frequency of occurrence of a specific input level, distortion compensation of high precision is realized.

What is claimed is:

1. A predistortion type distortion compensation apparatus for compensating distortion occurring in an amplifier for amplifying an input signal, comprising:

distortion generating means for generating distortion in an input signal, input signal level detecting means for detecting a level of the input signal, distortion control means for controlling the distortion generated by the distortion generating means by using a control value corresponding to the level of the input signal detected by the input signal level detecting means, distortion component level detecting means for detecting a level of distortion component contained in the amplified signal issued from the amplifier, integrating means for integrating the level of the distortion component detected by the distortion component detecting means in every level of the input signal detected by the input signal level detecting means, and control value updating means for updating the control value corresponding to the level used by the distortion control means so that the integration result of every level of the input signal obtained from the integrating means may be small.

2. A predistortion type distortion compensation apparatus according to claim 1, wherein the distortion control means is composed by using a memory for, storing the level of input signal and the control value in correspondence to each other.

3. A predistortion type distortion compensation apparatus according to claim 1, wherein the distortion generating means comprises a predistortion unit including a variable attenuator and a variable phase shifter, the input signal level detecting means comprises an envelope detector, the distortion control means comprises a compensation table including an attenuator table and a phase shifter table, the amplifier comprises a power amplifier, the distortion component level detecting means comprises a side band power measuring unit, the integrating means comprises a quantizing circuit, a first selection circuit, and plural integrating circuits, and the control value updating means comprises a control circuit and a second selection circuit, the input signal coming in from an input end of the predistortion type distortion compensation apparatus is divided into two signals, and an amplitude of one distribution signal is compensated of distortion by the variable attenuator in the predistortion unit according to the control from the attenuator table of the compensation table, a phase of this distribution signal is compensated of distortion by the variable phase shifter in the predistortion unit according to the control from the phase shifter table of the compensation table, and this distribution signal of which amplitude and phase are compensated of distortion is amplified by the power amplifier, and issued from an output end of the predistortion type distortion compensation apparatus, an envelope information of the other distribution signal is detected by the envelope detector, the control value for amplitude control corresponding to this detection result is read out by referring to the attenuator table of the compensation table and issued to a control terminal of the variable attenuator of the predistortion unit, and the control value for phase shift control corresponding to the detection result is read out by referring to the phase shifter table of the compensation table, and is issued to a control terminal of the variable phase shifter of the predistortion unit, and adjacent channel leak power contained in part of the amplified signal issued from the power amplifier is measured by the side band power measuring unit, the detection result of the envelope detector is converted into a digital value by the quantizing circuit, one integrating circuit is selected and changed over out of plural integrating circuits as the output destination of the adjacent channel leak power issued from the side band power measuring unit by the first selection circuit depending on the digital value entered from the quantizing circuit, the adjacent channel leak power issued from the first selection circuit is integrated by each integrating circuit, one integrating circuit is selected from these plural integrating circuits by the second selection circuit according to control from the control circuit, and control values to be stored in the attenuator table and phase shifter table of the compensation table are updated by the control circuit according to the integration result obtained from the selected integrating circuit.

4. A predistortion type distortion compensation apparatus for compensating distortion occuring in an amplifier for amplifying an input signal, comprising:

distortion generating means for generating distortion in an input signal, input signal level detecting means for detecting a level of the input signal, distortion control means for controlling the distortion generated by the distortion generating means by using a control value corresponding to the level of the input signal detected by the input signal level detecting means, distortion component level detecting means for detecting a level of distortion component contained in the amplified signal issued from the amplifier, counting means for counting inputs at specified level of the level of input signal detected by the input signal level detecting means, integrating means for integrating the level of the distortion component detected by the distortion component detecting means when the level of the input signal detected by the input signal level detecting means is the specified level for a period until a specified value is counted by the counting means, and control value updating means for updating the control value corresponding to the specified level used by the distortion control means so that the integration result of the integrating means may be small.

5. A predistortion type distortion compensation apparatus according to claim 4, wherein the distortion control means is composed by using a memory for storing the level of input signal and the control value in correspondence to each other.

6. A predistortion type distortion compensation apparatus according to claim 4, wherein the distortion generating means comprises a predistortion unit including a variable attenuator and a variable phase shifter, the input signal level detecting means comprises an envelope detector, the distortion control means comprises a compensation table including an attenuator table and a phase shifter table, the amplifier comprises a power amplifier, the distortion component level detector comprises a side band power measuring unit, the counting means comprises a quantizing circuit, comparator and a counter, the integrating means comprises a changeover circuit and integrating circuit, and the control value updating means comprises a control circuit, the input signal coming in from an input end of the predistortion type distortion compensation apparatus is divided into two signals, and an amplitude of one distribution signal is compensated of distortion by the variable attenuator in the predistortion unit according to the control from the attenuator table of the compensation table, a phase of this distribution signal is compensated of distortion by the variable phase shifter in the predistortion unit according to the control from the phase shifter table of the compensation table, and this distribution signal of which amplitude and phase are compensated of distortion is amplified by the power amplifier, and issued from an output end of the predistortion type distortion compensation apparatus, an envelope information of the other distribution signal is detected by the envelope detector, the control value for amplitude control corresponding to this detection result is read out by referring to the attenuator table of the compensation table and issued to a control terminal of the variable attenuator of the predistortion unit, and the control value for phase shift control corresponding to the detection result is read out by referring to the phase shifter table of the compensation table, and is issued to a control terminal of the variable phase shifter of the predistortion unit, and adjacent channel leak power contained in part of the amplified signal issued from the power amplifier is measured by the side band power measuring unit, the detection result of the envelope detector is converted into a digital value by the quantizing circuit, a specified ON signal is issued to the control terminal of the changeover circuit and counter from the comparator when the level of the input signal corresponding to this digital value is included in a level range on the basis of the threshold information from the control circuit, the count value is increased by the counter every time the ON signal is entered in the counter from the comparator, the adjacent channel leak power issued from the side band power measuring unit is issued to the integrating circuit by the changeover circuit when the ON signal is entered in the changeover circuit from the comparator, the adjacent channel leak power is integrated by the integrating circuit, and control values to be stored in the attenuator table and phase shifter table of the compensation table are updated by the control circuit according to the integration result.

7. A CDMA radio base station apparatus for compensating the distortion occurring in an amplifier for amplifying a transmission signal by a predistortion type distortion compensation apparatus, said predistortion type distortion compensation apparatus comprising:

distortion generating means for generating distortion in an input signal, input signal level detecting means for detecting a level of the input signal, distortion control means for controlling the distortion generated by the distortion generating means by using a control value corresponding to the level of the input signal detected by the input signal level detecting means, distortion component level detecting means for detecting a level of distortion component contained in the amplified signal issued from the amplifier, integrating means for integrating the level of the distortion component detected by the distortion component detecting means in every level of the input signal detected by the input signal level detecting means, and control value updating means for updating the control value corresponding to the level used by the distortion control means so that the integration result of every level of the input signal obtained from the integrating means may be small.

8. A CDMA radio base station apparatus according to claim 7, wherein the distortion control means of the predistortion type distortion compensation apparatus is composed by using a memory for storing the level of input signal and the control value in correspondence to each other.

9. A CDMA radio base station apparatus for compensating the distortion occurring in an amplifier for amplifying a transmission signal by a predistortion type distortion compensation apparatus, said predistortion type distortion compensation apparatus comprising:

distortion generating means for generating distortion in an input signal, input signal level detecting means for detecting a level of the input signal, distortion control means for controlling the distortion generated by the distortion generating means by using a control value corresponding to the level of the input signal detected by the input signal level detecting means, distortion component level detecting means for detecting a level of distortion component contained in the amplified signal issued from the amplifier, counting means for counting inputs at specified level of the level of input signal detected by the input signal level detecting means, integrating means for integrating the level of the distortion component detected by the distortion component detecting means when the level of the input signal detected by the input signal level detecting means is the specified level for a period until a specified value is counted by the counting means, and control value updating means for updating the control value corresponding to the specified level used by the distortion control means so that the integration result of the integrating means may be small.

10. A CDMA radio base station apparatus according to claim 9, wherein the distortion control means of the predistortion type distortion compensation apparatus is composed by using a memory for storing the level of input signal and the control value in correspondence to each other.

11. A CDMA radio repeater amplifying apparatus for compensating the distortion occurring in an amplifier for amplifying a transmission signal by a predistortion type distortion compensation apparatus, said predistortion type distortion compensation apparatus comprising:

distortion generating means for generating distortion in an input signal, input signal level detecting means for detecting a level of the input signal, distortion control means for controlling the distortion generated by the distortion generating means by using a control value corresponding to the level of the input signal detected by the input signal level detecting means, distortion component level detecting means for detecting a level of distortion component contained in the amplified signal issued from the amplifier, integrating means for integrating the level of the distortion component detected by the distortion component detecting means in every level of the input signal detected by the input signal level detecting means, and control value updating means for updating the control value corresponding to the level used by the distortion control means so that the integration result of every level of the input signal obtained from the integration means may be small.

12. A CDMA radio repeater amplifying apparatus according to claim 11, wherein the distortion control means of the predistortion type distortion compensation apparatus is composed by using a memory for storing the level of input signal and the control value in correspondence to each other.

13. A CDMA radio repeater amplifying apparatus for compensating the distortion occurring in an amplifier for amplifying a transmission signal by a predistortion type distortion compensation apparatus, said predistortion type distortion compensation apparatus comprising:

distortion generating means for generating distortion in an input signal, input signal level detecting means for detecting a level of the input signal, distortion control means for controlling the distortion generated by the distortion generating means by using a control value corresponding to the level of the input signal detected by the input signal level detecting means, distortion component level detecting means for detecting a level of distortion component contained in the amplified signal issued from the amplifier, counting means for counting inputs at specified level of the level of input signal detected by the input signal level detecting means, integrating means for integrating the level of the distortion component detected by the distortion component detecting means when the level of the input signal detected by the input signal level detecting means is the specified level for the period until a specified value is counted by the counting means, and control value updating means for updating the control value corresponding to the specified level used by the distortion control means so that the integration result of the integrating means may be small.

14. A CDMA radio repeater amplifying apparatus according to claim 13, wherein the distortion control means of the predistortion type distortion compensation apparatus is composed by using a memory for storing the level of input signal and the control value in correspondence to each other.

* * * * *